(12) United States Patent
Hiraoka

(10) Patent No.: US 9,882,175 B2
(45) Date of Patent: Jan. 30, 2018

(54) METHOD FOR MANUFACTURING DISPLAY PANEL

(71) Applicant: JOLED INC., Chiyoda-ku (JP)

(72) Inventor: Tomomi Hiraoka, Tokyo (JP)

(73) Assignee: JOLED INC., Chiyoda-ku (JP)

(*) Notice: Subject to any disclaimer, the term of this patent is extended or adjusted under 35 U.S.C. 154(b) by 0 days.

(21) Appl. No.: 15/317,331

(22) PCT Filed: Jun. 9, 2015

(86) PCT No.: PCT/JP2015/002891
§ 371 (c)(1),
(2) Date: Dec. 8, 2016

(87) PCT Pub. No.: WO2015/190092
PCT Pub. Date: Dec. 17, 2015

(65) Prior Publication Data
US 2017/0117506 A1    Apr. 27, 2017

(30) Foreign Application Priority Data

Jun. 12, 2014  (JP) .................................. 2014-121705

(51) Int. Cl.
*H01L 51/56* (2006.01)
*H01L 27/32* (2006.01)

(52) U.S. Cl.
CPC .......... *H01L 51/56* (2013.01); *H01L 27/3276* (2013.01); *H01L 2227/323* (2013.01); *H01L 2251/568* (2013.01)

(58) Field of Classification Search
None
See application file for complete search history.

(56) References Cited

U.S. PATENT DOCUMENTS

2007/0081105 A1    4/2007  Park et al.
2009/0061720 A1    3/2009  Fujimaki
(Continued)

FOREIGN PATENT DOCUMENTS

JP        60-164791 A      8/1985
JP       2002-341304 A    11/2002
(Continued)

OTHER PUBLICATIONS

International Search Report dated Aug. 18, 2015 in PCT/JP2015/002891 filed Jun. 9, 2015.

*Primary Examiner* — Asok K Sarkar
(74) *Attorney, Agent, or Firm* — Oblon, McClelland, Maier & Neustadt, L.L.P.

(57) ABSTRACT

A method for manufacturing a display panel in which a plurality of pixels are arranged, each of the plurality of pixels including an organic EL element and a wire, the method comprising: stacking a light-emitting layer included in the organic EL element and a drive circuit layer included in the wire; and irradiating a predetermined area of the wire having a short-circuit point with a femtosecond laser from the back surface, the laser not passing through the light-emitting layer, the irradiating including: reducing a beam diameter to be approximately a wire width, and irradiating the predetermined area with the femtosecond laser; and reducing the beam diameter to be less than the beam diameter in the reducing the beam diameter, and irradiating corners of the predetermined area to disconnect the wire at the predetermined area.

6 Claims, 8 Drawing Sheets

(56) References Cited

U.S. PATENT DOCUMENTS

2013/0102094 A1    4/2013  Hiraoka et al.
2015/0155302 A1*   6/2015  Matsui .............. G02F 1/136259
                                                              257/72

FOREIGN PATENT DOCUMENTS

| JP | 2007-102223 A | 4/2007 |
| JP | 2008-122810 A | 5/2008 |
| JP | 2008-235178 A | 10/2008 |
| JP | 2009-64607 A | 3/2009 |
| JP | 2012-247547 A | 12/2012 |
| JP | 2013-114749 A | 6/2013 |
| WO | 2013/038454 A1 | 3/2013 |

* cited by examiner

METHOD FOR MANUFACTURING DISPLAY PANEL

TECHNICAL FIELD

The present disclosure relates to a method for manufacturing a display panel.

BACKGROUND ART

In a conventional organic electroluminescent (hereinafter referred to as an organic EL) element in which an organic layer is interposed between an anode (positive electrode) and a cathode (negative electrode), there are cases where a short-circuit between the anode and cathode occurs due to adhering or intrusion of conductive foreign matter to the organic EL element in a manufacturing process. In this case, there is a method for repairing (eliminating) a portion where a short-circuit has occurred by irradiating the portion with a laser.

Patent Literature 1 discloses a method for repairing an organic light-emitting display device. The method for repairing an organic light-emitting display device is such that in an organic light-emitting display device in which pixels are arranged in a two dimensional manner, the pixels each including an organic light-emitting element that emits light by application of a voltage to an organic light-emitting layer, the outer periphery of a light-emitting area of a defective pixel, which has become a constant bright point, is irradiated with a laser. With this, defective area in an electrode and the like can be reduced, and it is possible to reduce deterioration of display quality.

CITATION LIST

Patent Literature

[PTL 1] Japanese Unexamined Patent Application Publication No. 2009-64607

SUMMARY OF INVENTION

Technical Problem

In an active-matrix display panel having a drive circuit for controlling turning on and off of an organic EL element, finer circuit elements are demanded with increasing resolution. Accordingly, the distance between adjacent wires connecting circuit elements is also decreased, and the frequency of occurrence of a short-circuit defect between wires is increased.

Here, when a wire, in which a short-circuit defect has occurred, is irradiated with a laser beam to eliminate the short-circuit defect, adjacent wires may also be irradiated with the laser beam depending on the irradiation conditions of the laser beam, and thus a secondary problem is expected to occur.

The present invention has been made in view of the above-mentioned problem, and it is an object of the invention to provide a method for manufacturing a display panel that allows a wiring defect of the display panel to be repaired stably with high accuracy.

Solution to Problem

In order to solve the aforementioned problem, a method for manufacturing a display panel according an aspect of the present invention is a method for manufacturing a display panel in which a plurality of pixels are arranged, each of the plurality of pixels including a light-emitting element, and a circuit element and a wire for driving light-emission of the light-emitting element, the method comprising: stacking a light-emitting layer included in the light-emitting element and a drive circuit layer included in the circuit element and the wire; and irradiating a predetermined area of a wire with a femtosecond laser from a side of the drive circuit layer opposite the light-emitting layer, the wire having a short-circuit point at which a short-circuit has occurred with the circuit element or the another wire, the irradiating including: reducing a beam diameter of the femtosecond laser in the drive circuit layer to be approximately a wire width, and irradiating the predetermined area with the femtosecond laser, and after the reducing the beam diameter and irradiating the predetermined area, reducing the beam diameter of the femtosecond laser in the drive circuit layer to be less than the beam diameter in the reducing the beam diameter, and irradiating corners, which are an end of the predetermined area in a wire extending direction and an end of the predetermined area in a wire width direction, with the femtosecond laser to disconnect the wire at the predetermined area.

Advantageous Effects of Invention

By the method for manufacturing a display panel according to the present invention, it is possible to repair a wire having a short-circuit point stably with high accuracy.

DESCRIPTION OF EMBODIMENT

Hereinafter, an embodiment of a method for manufacturing a display panel will be described using the drawings. It should be noted that the subsequently-described embodiment shows a specific preferred example of the present disclosure. Therefore, numerical values, shapes, materials, structural components, the arrangement and connection of the structural components, steps, the sequence of the steps, etc., shown in the following embodiment are mere examples, and are not intended to limit the scope of the present invention. Therefore, among the structural components in the subsequent embodiment, components not recited in any one of the independent claims which indicate the broadest concepts of the present invention are described as arbitrary structural components.

It should be noted that the respective figures are schematic diagrams and are not necessarily precise illustrations. Furthermore, in the respective figures, the same reference sign is given to substantially identical components, and redundant description is omitted or simplified.

Embodiment

A method for manufacturing an organic EL display panel according to this embodiment includes:
(1) a process of stacking a light-emitting layer and a drive circuit layer, the light-emitting layer being included in an organic EL element which is a light emitting element, the drive circuit layer being included in a circuit element and a wire; and
(2) a process of irradiating a wiring having a short-circuit point with a femtosecond laser from the side opposite to the light-emitting side of the drive circuit layer.

First, the configuration of an organic EL substrate 1A will be described, the organic EL substrate 1A being an unfinished product of a display panel after the above-described stacking process is completed.

[1. Configuration of Organic EL Substrate]

Figure 1:
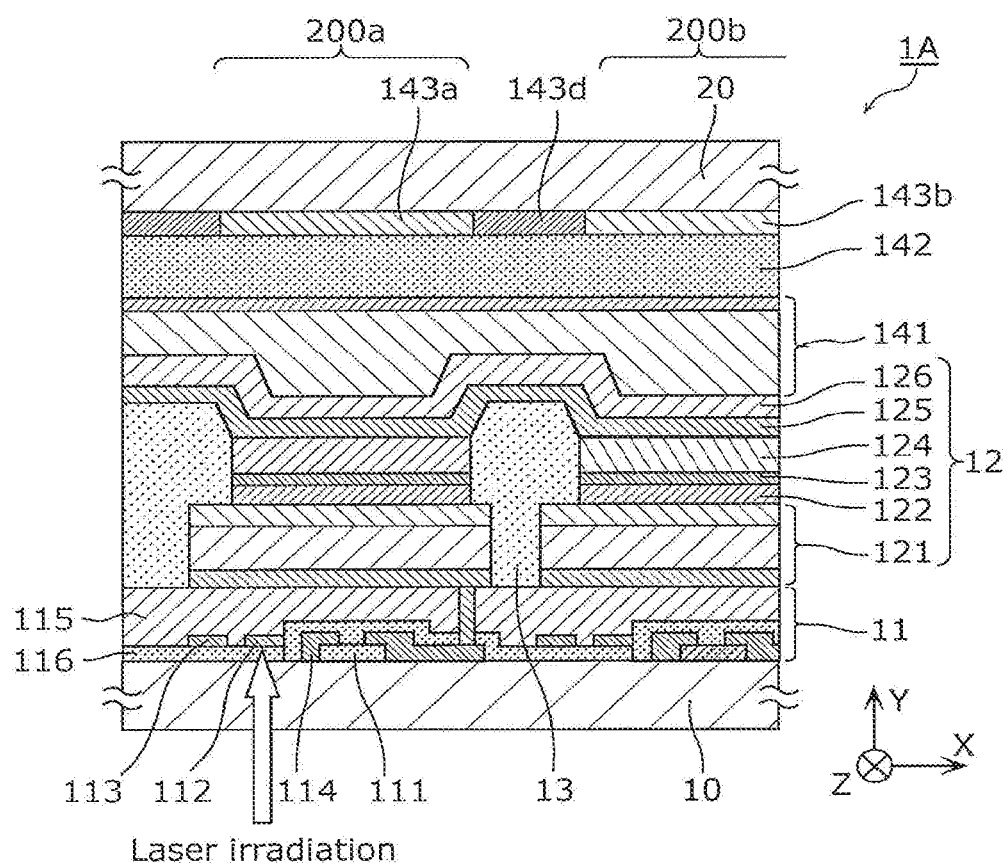
FIG. 1 is a structural sectional view of an organic EL substrate.

FIG. 1 is a structural sectional view of an organic EL substrate. The organic EL substrate 1A shown in FIG. 1 is an organic functional device that includes an anode, a cathode, and an organic light-emitting layer interposed between the anode and cathode. In the organic EL substrate 1A shown in FIG. 1, pixels are arranged in rows and columns, each of the pixels being one unit pixel including a red pixel 200a, a green pixel 200b, and a blue pixel 200c (not illustrated) each serving as a sub pixel are adjacently arranged. Each sub pixel includes, on a substrate 10, a drive circuit layer 11, a light-emitting layer 12, a bank 13, a thin-film sealing layer 141, a resin sealing layer 142, a color filter 143, and a transparent substrate 20.

The substrate 10 and the transparent substrate 20 are substrates that protect the back surface and the light-emitting surface of the organic EL substrate 1A, and are, for example, transparent alkali-free glass with a thickness of 0.5 mm.

The drive circuit layer 11 is formed on the substrate 10, and includes a thin-film transistor (TFT) 111, wires 112 and 113, a planarization film 115, and an insulation film 116.

The TFT 111 is a circuit element for light-emission driving the organic EL element described later. The TFT 111 is, for example, a TFT for selection that controls the timing for writing a signal voltage to each pixel, or a TFT for drive that causes a current corresponding to a signal voltage to flow through the organic EL element. In addition, the TFT 111 has an electrode wire 114 included in one of a source electrode and a drain electrode, and an electrode wire included in the other of the source electrode and the drain electrode is electrically connected to an anode 121.

The wires 112 and 113 are wires for light-emission driving the organic EL element described later.

The light-emitting layer 12 includes an anode 121, a hole injection layer 122, an organic light-emitting layer 123, an electron transport layer 124, an electron injection layer 125, and a cathode 126, thereby constituting an organic EL element which is a light-emitting element.

The planarization film 115 is a layer that serves as the base of the light-emitting layer 12 which is an upper layer of the drive circuit layer 11, and that planarizes the uppermost surface of the drive circuit layer 11. The planarization film 115 is composed of, for example, an insulating organic material.

The insulation film 116 is a layer for separately insulating the substrate 10, the TFT 111, the wires 112 and 113 from each other.

The anode 121 is an anode to which a hole is supplied, in other words, an anode in which a current flows from an external circuit, and has a structure in which a reflective electrode composed of, for example, Al or silver alloy APC is stacked on the planarization film 115. The thickness of the reflective electrode is 10 to 40 nm, as an example.

The hole injection layer 122 is a layer that is mainly composed of a material having a hole injection property. The material having a hole injection property is a material that has a function of stably injecting a hole injected from the anode 121 to the organic light-emitting layer 123 or of supporting generation of a hole and injecting the hole to the organic light-emitting layer 123.

The organic light-emitting layer 123 is a layer that emits light by application of a voltage across the anode 121 and the cathode 126, and has a structure in which α-NPD (Bis[N-(1-naphthyl)-N-phenyl]benzidine) as a lower layer and Alq3 (tris-(8-hydroxyquinoline)aluminum as an upper layer are stacked, for example.

The electron transport layer 124 is a layer that is mainly composed of a material having an electron transport property. The material having an electron transport property has an electron-accepting property, and combines a property likely to become a negative ion and a property of transmitting a generated electron by a charge transfer reaction between molecules, and thus provides a material suitable for charge transport from the cathode 126 to the organic light-emitting layer 123.

The electron injection layer 125 is a layer that is mainly composed of a material having an electron injection property. The material having an electron injection property is a material that has a function of stably injecting an electron injected from the cathode 126 to the organic light-emitting layer 123 or of supporting generation of an electron and injecting the electron to the organic light-emitting layer 123.

The cathode 126 is a cathode to which an electron is supplied, in other words, a cathode from which a current flows out to an external circuit, and has a stacked structure of, for example, ITO which is a transparent metal oxide. The thickness of the electrode is 10 to 40 nm, as an example.

The bank 13 is a wall for separating the organic light-emitting layer 123 into sub pixels, and is composed of, for example, a photosensitive resin.

The thin-film sealing layer 141 is composed of, for example, a silicon nitride, and has a function of blocking the above-described organic light-emitting layer 123 and the cathode 126 from vapor and oxygen. This is for protecting the organic light-emitting layer 123 itself and the cathode 126 against deterioration (oxidization) due to exposure to vapor and oxygen.

The resin sealing layer 142 is an acrylic or epoxy-based resin, and bonds the color filter 143 to the integrally formed layers from the planarization film 115 formed on the above-described substrate to the thin-film sealing layer 141.

The color filter 143 is formed as color filters 143a, 143b, and 143c (not illustrated) for making color adjustment of red, green, and blue on the lower surface of the transparent substrate 20 so as to cover each light-emitting area separated by the bank 13. In addition, the color filter 143 has a black matrix 143d between pixel areas.

It should be noted that depending on the material configuration of the organic light-emitting layer 123, there are instances where the color filter 143 may not be provided, which is not a required component.

It should be noted that the above-described configuration of the anode 121, the organic light-emitting layer 123 and the cathode 126 is the basic configuration of an organic EL element, and when a suitable voltage is applied across the anode 121 and cathode 126, holes and electrons are injected to the organic light-emitting layer 123 from the anode 121 and the cathode 126, respectively. These injected holes and electrons are recombined in the organic light-emitting layer 123 to cause energy which excites the light-emitting material of the organic light-emitting layer 123 to emit light.

It should be noted that the materials of the hole injection layer 122, the electron transport layer 124, and the electron injection layer 125 are not limited in this embodiment, and well-known organic materials or inorganic materials are used. Also, any of the hole injection layer 122, the electron transport layer 124 and the electron injection layer 125 may not be disposed, and a hole transport layer may be disposed.

[2. Dealing with Wiring Short-Circuit]

Here, when a short-circuit occurs in a wire of the drive circuit layer 11 in the organic EL substrate 1A in the above-mentioned configuration, it is expected for example that the TFT for drive goes out of control and pixels do not emit light properly.

Figure 2:
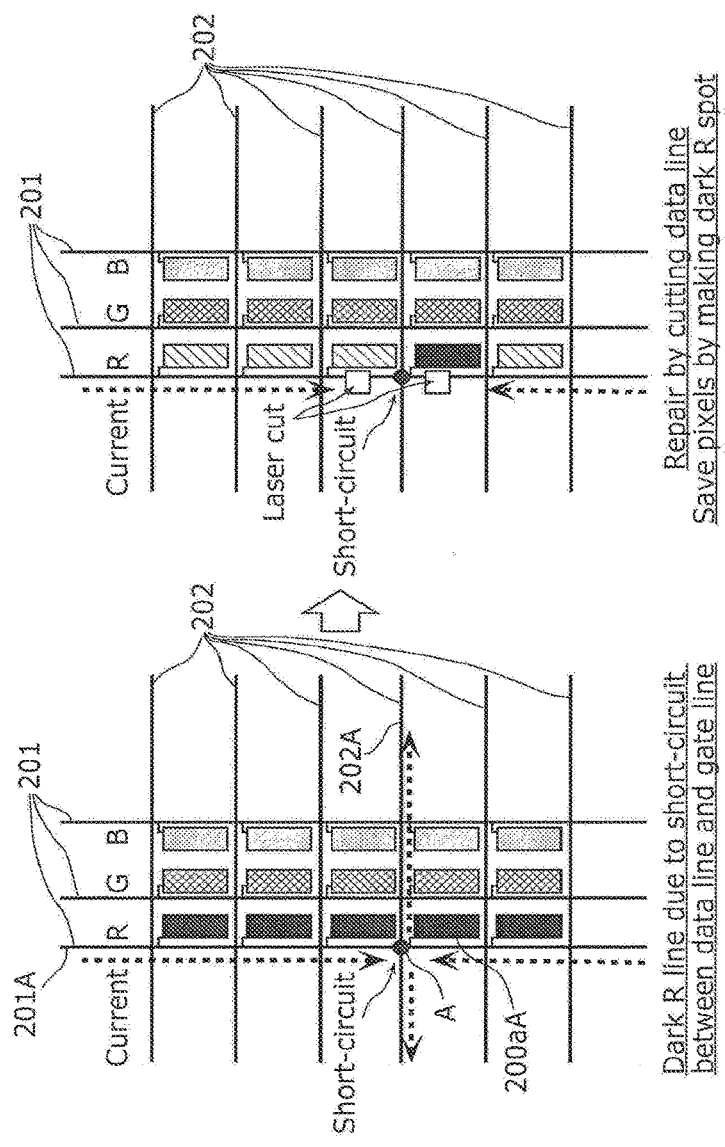
FIG. 2 is a diagram illustrating repair handling in the case where a display defect occurs due to a wiring short-circuit.

FIG. 2 is a diagram illustrating repair handling in the case where a display defect occurs due to a wiring short-circuit. The left side of FIG. 2 shows a display state of the display panel in the case where a short-circuit occurs between a data line 201 and a gate line 202, and the right side of FIG. 2 shows a display state of the display pane after repair.

As shown in FIG. 2, in a display area where a plurality of pixels are arranged in rows and columns, a gate line 202 is disposed for each pixel row, and a data line 201 is disposed for each pixel column. In addition, as shown on the left side of FIG. 2, a short-circuit occurs at crosspoint A between the data line 201A and the gate line 202A. Accordingly, a current path from the data line 201A to the gate line 202A is formed, and a signal voltage supplied to the data line 201A is not supplied to each red pixel 200a belonging to the pixel column in which the data line 201A is disposed. As such, each red pixel 200a belonging to the pixel column does not emit light in response to a signal voltage, and is a constantly dark spot pixel (in FIG. 2, a pixel displayed in black indicates nonlight-emitting), and a pixel column in which the red pixels 200a do not emit light, what is called a red dark line is formed on the display panel.

On the other hand, in the method for manufacturing a display panel according to this embodiment, as shown on the right side of FIG. 2, the data line 201A having a short-circuit point at the crosspoint A is irradiated with a laser. Accordingly, the short-circuit point of the data line 201A is isolated. More specifically, two areas interposing the crosspoint A in the data line 201A therebetween are irradiated with a femtosecond laser from the opposite side (from the substrate 10) to the light-emitting layer 12 with respect to the drive circuit layer 11. Thus, the data line 201A is broken (non-conductive) at the two areas. Specifically, the area of the data line 201A, including the crosspoint A and interposed by the two areas, is isolated from the other area of the data line 201A.

The isolation of the area of the data line 201A, including the crosspoint A and interposed by the two areas in this manner allows only the red pixel 200 aA connected to the isolated area to be a constantly dark spot pixel and other red pixels 200a connected to the data line 201A to be saved (emitted normally).

It should be noted that the area of the data line 201A, including the crosspoint A may not be isolated by the two areas, and the data line 201A may be broken at one of the two areas. In this case, it is not possible to isolate the area of the data line 201A, including the crosspoint A. However, the data line 201A is divided into two areas: the area including the crosspoint A and the area not including the crosspoint A. Thus, the red pixels 200a connected to the area not including the crosspoint A can be converted to normal pixels.

[3. Display Panel Manufacturing Method]

Hereinafter, a method for manufacturing a display panel according to this embodiment will be described.

Figure 3:
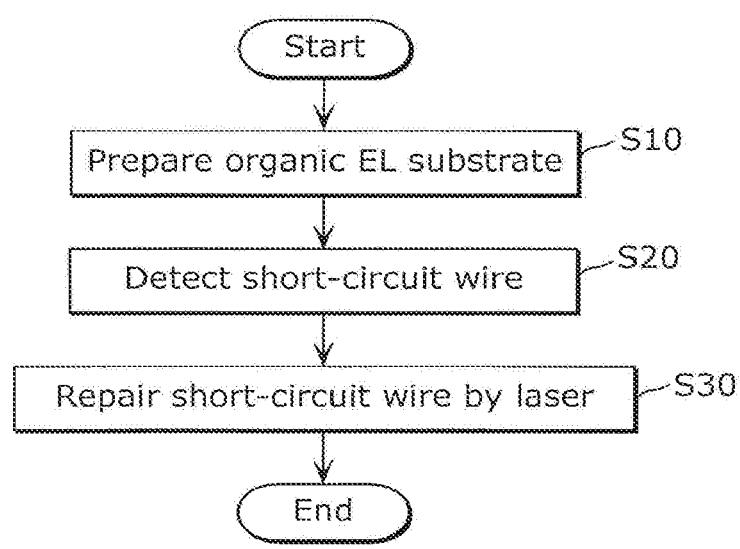
FIG. 3 is a flowchart illustrating a method for manufacturing a display panel according to this embodiment.

FIG. 3 is a flowchart illustrating the method for manufacturing a display panel according to the embodiment.

First, the organic EL substrate 1A is prepared (S10). The organic EL substrate 1A is an unfinished product in a process of manufacturing a display panel in which a plurality of pixels are arranged, each of the pixels having an organic EL element, and a circuit element and a wire for light-emission driving the organic EL element. This process corresponds to a stacking process of stacking the light-emitting layer 12 included in the organic EL element and the drive circuit layer 11 included in the circuit element.

Next, presence of short-circuit wire is detected in the organic EL substrate 1A having the plurality of pixels formed in step S10 (S20).

Finally, in step S20, in the organic EL substrate 1A in which short-circuit wire is detected, two areas interposing a short-circuit point in a wire therebetween are irradiated with a femtosecond laser from the opposite side to the light-emitting layer 12 with respect to the drive circuit layer 11, the wire having the short-circuit point where a short-circuit occurs with a circuit element or another wire (S30). The process in step S30 is a characteristic process in the method for manufacturing a display panel according to this embodiment.

A high quality display panel is completed with a high yield by the above process.

Hereinafter, the above-described three processes will be described in detail.

[3-1. Stacking Process]

First, the process (S10) of preparing the organic EL substrate 1A shown in FIG. 2 will be described.

On the substrate 10, the drive circuit layer 11 including the TFT 111, the wires 112 and 113, and the planarization film 115 is formed.

Next, the light-emitting layer 12 is formed on the drive circuit layer 11. The anode 121 is formed in such a manner that 30 nm Al film is formed on the planarization film 115, for example, by the sputtering method, and subsequently, a patterning process is performed by photolithography and wet etching. The hole injection layer 122 is formed such that, for example, PEDOT is dissolved in a solvent composed of xylene, and the PEDOT solution is spin-coated on the anode 121. The organic light-emitting layer 123 is formed by depositing α-NPD, Alq3 on the hole injection layer 122, for example, by a vacuum evaporation method. The electron transport layer 124 is formed on the organic light-emitting layer 123. The electron injection layer 125 is formed by spin-coating the electron transport layer 124 with a solution prepared by dissolving, for example, polyphenylene vinylene (PPV) in a solvent composed of xylene or chloroform. The cathode 126 is obtained by forming indium tin oxide (ITO) up to 35 nm on the electron injection layer 125 by the sputtering method. It should be noted that the bank 13 composed of a surface photosensitive resin is formed at a predetermined position between the process of forming the anode 121 and the process of forming the hole injection layer 122.

Next, 500 nm silicon nitride is deposited on the cathode 126, for example, by the plasma chemical vapor deposition (CVD) method, whereby the thin-film sealing layer 141 is formed.

Next, the surface of the thin-film sealing layer 141 is coated with the resin sealing layer 142. Subsequently, the color filter 143 and the transparent substrate 20 are disposed on the coated resin sealing layer 142. Specifically, for example, a transparent glass 18, in which the color filter 143 is formed, is disposed on the coated resin sealing layer 142. While the transparent substrate 20 is pressurized downward from the upper surface, the resin sealing layer 142 is cured by adding a heat or energy ray, and the transparent substrate 20 and the thin-film sealing layer 141 are bonded.

The organic EL substrate 1A shown in FIG. 2 is formed by the above process. It should be noted that the processes of forming the light-emitting layer 12 are not limited by this embodiment.

[3-2. Short-Circuit Wiring Detection Process]

Next, the process (S20) of detecting a short-circuit wire of the organic EL substrate 1A will be described. As shown in FIG. 2, when a short-circuit occurs between the data line 201A and the gate line 202A, each pixel connected to the data line 201A becomes a constantly dark spot pixel, and a dark line occurs in the display area.

In step S20, first, lighting inspection of the organic EL substrate 1A formed in step S10 is conducted. Specifically, a voltage for light emission, by which each organic EL element emits light, is applied to all the pixels of the organic EL substrate 1A all at once by a data line drive circuit and a scanning line drive circuit included in the organic EL substrate 1A or a lighting inspection device, and each organic EL element is caused to emit light. During light emission of the organic EL elements, all the pixels are captured by a CCD camera or the like.

The light-emission luminance of each pixel is calculated from captured images during the light emission, and a pixel having a light-emission luminance of a predetermined threshold value or lower, what is called a dark spot pixel is detected.

Next, the detected dark spot pixel is observed under magnification. Specifically, the dark spot pixel is observed using, for example, a camera microscope. At this point, in the area of the dark spot pixel observed under magnification, a short-circuit point of a wire is identified.

Also, the detection of a short-circuit wire is not limited to the method described above. When a light-emission state during the light emission is observed, for example, a simple luminance meter or naked-eye observation may be used without using a CCD camera.

[3-3. Short-Circuit Wire Repair Process]

Next, the short-circuit wire repair process (S30) by laser irradiation, which is the main part of the method for manufacturing a display panel according to this embodiment, will be described.

This process includes (1) a first laser irradiation process of reducing the beam diameter of a femtosecond laser in the drive circuit layer 11 to be approximately the wire width, and irradiating two areas interposing a short-circuit point therebetween with the femtosecond laser; and (2) a second laser irradiation process of reducing the beam diameter of the femtosecond laser in the drive circuit layer 11 to be less than the beam diameter in the first laser irradiation process, and irradiating corners, which are the ends of the two areas interposing the short-circuit point therebetween in a wire extending direction and the ends of the two areas in a wire width direction, with the femtosecond laser.

According to this, since a femtosecond laser irradiation is performed with a reduced beam diameter equal to approximately the wire width in the first laser irradiation process, it is possible to deform a short-circuit wire without causing damage to adjacent wires with a narrow pitch by a laser. In addition, since the corners is irradiated with a femtosecond laser with a reduced beam diameter of the femtosecond laser less than the wire width in the second laser irradiation process, it is possible to completely disconnect the corners of the short-circuit wire which has not been completely cut in the first laser irradiation process.

With this, the area of data line, including a short-circuit point and interposed by the two areas can be isolated, and thus only the pixels connected to the isolated area becomes constantly dark spot pixels, and other pixels can be saved. Thus, it is possible to repair a wire having a short-circuit point stably with high accuracy.

Hereinafter, the repair process will be described in detail.

Figure 4:
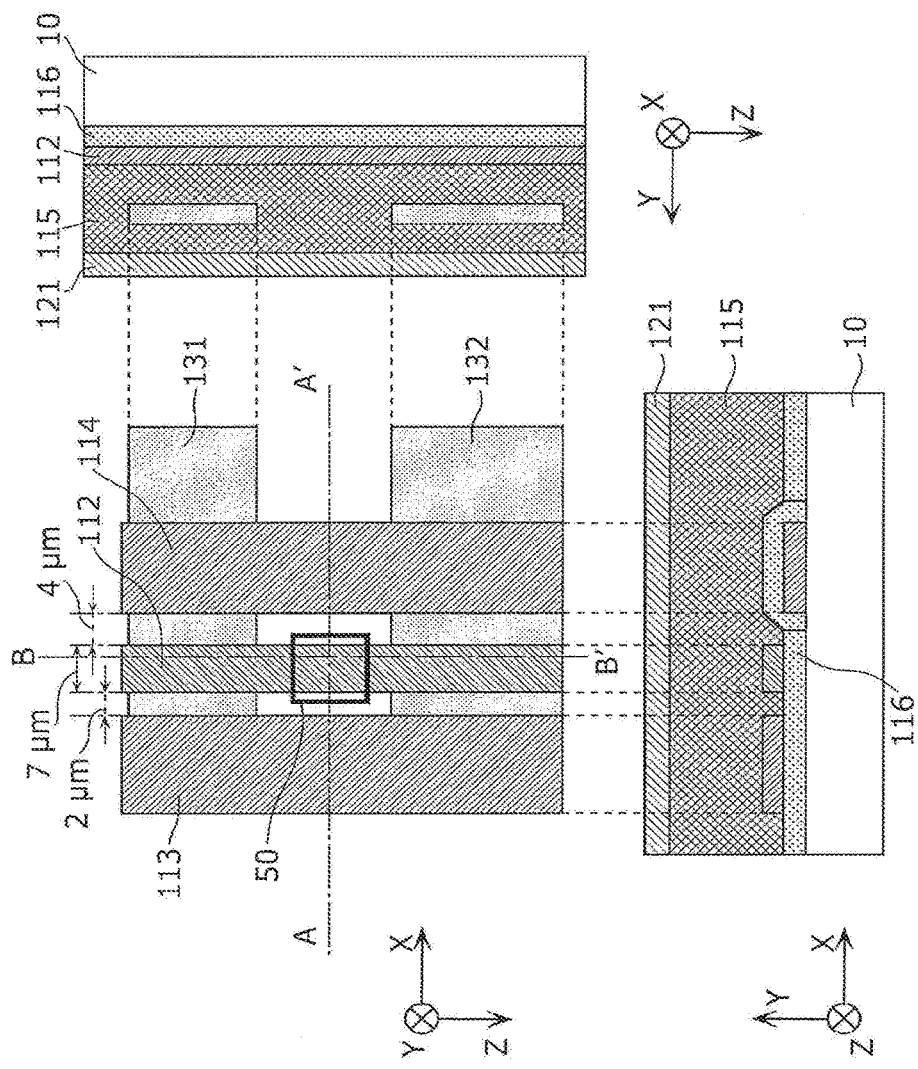
FIG. 4 is a three-view diagram illustrating an example of a wiring structure of a drive circuit layer according to the embodiment.

FIG. 4 is a three-view diagram illustrating an example of the wiring structure of a drive circuit layer according to the embodiment. FIG. 4 shows a perspective plan view of the drive circuit layer 11 when viewed from the image display side (in the Y-axis negative direction), and sectional views when the perspective plan view is cut along A-A' and B-B'. The wires 112 and 113, and the electrode wire 114 are disposed in parallel to each other in the Z-axis direction of the drive circuit layer 11. Also, in an upper portion of these, wires 131 and 132 are disposed in parallel to each other in a direction intersecting perpendicularly to the wires 112 and 113, and the electrode wire 114. Here, the distance between the wires 112 and 113 is, for example, 2 μm, and the distance between the wire 112 and the electrode wire 114 is, for example, 4 μm. In this embodiment, it is assumed that a short-circuit defect has occurred in the wire 112. Hereinafter, the process of irradiating the wire 112 with a femtosecond laser will be described.

Figure 5:
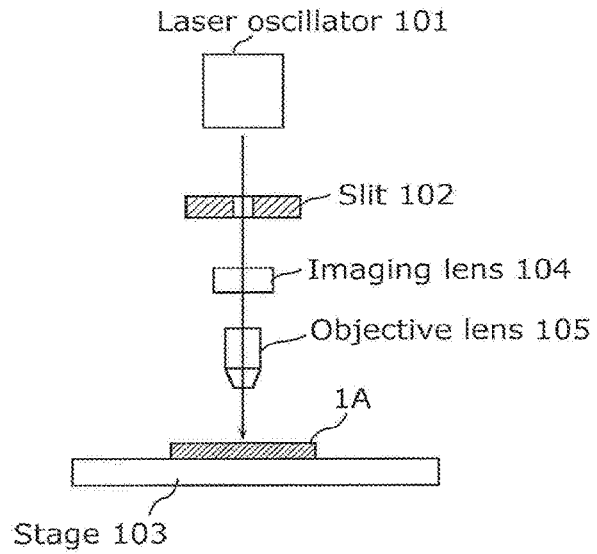
FIG. 5 is a schematic configuration diagram of a laser irradiation system according to the embodiment.

FIG. 5 is a schematic configuration diagram of a laser irradiation system according to the embodiment. The laser irradiation system shown in FIG. 5 includes a laser oscillator 101, a slit 102, a stage 103, an imaging lens 104, and an objective lens 105. Also, the organic EL substrate 1A is fixedly disposed on the stage 103.

The laser oscillator 101 can oscillate a femtosecond pulse laser with a wavelength of 532 to 1600 nm and an output energy of 1 to 30 μJ, for example. The range of preferred pulse width of such a femtosecond pulse laser is 100 fsec (femtosecond) to 20 psec (pico second). Irradiation with a femtosecond pulse laser allows a metal wire particularly in an amorphous (non-crystalline) state to be easily fabricated and deformed.

In this embodiment, a laser is focused on a wire of the drive circuit layer 11, and the wire is fabricated and deformed. When laser irradiation is performed with a pulse width of 1 nsec or greater, damage is given to the outer periphery of the area which is irradiated with a laser beam on the wire, and adjacent wires are damaged. In summary, by irradiating the organic EL substrate 1A with a femtosecond pulse laser, only the wire to be fabricated can be fabricated with high accuracy without giving damage to adjacent wires which are not to be fabricated.

Also, in the laser radiation system shown in FIG. 5, there are provided the slit 102 having a slit width smaller than the beam focus diameter, and the imaging lens 104 which is an imaging system between the laser oscillator 101 and the objective lens 105. A laser beam with a small variation in beam energy is obtained. Also, for example, the objective lens 105 with a magnification of 20 times is used, and in this embodiment, the slit width of the first slit used in the first laser irradiation process is 200 μm, and the slit width of the second slit is 100 μm. Accordingly, on a wire to be fabricated, the beam diameter is 10 μm in the first laser irradiation process, and the beam diameter is 5 μm in the second laser irradiation process.

Also, the stage 103 is movable in a height direction and in a planar direction, and has a function of fixing an object to be repaired with a laser.

Figure 6:
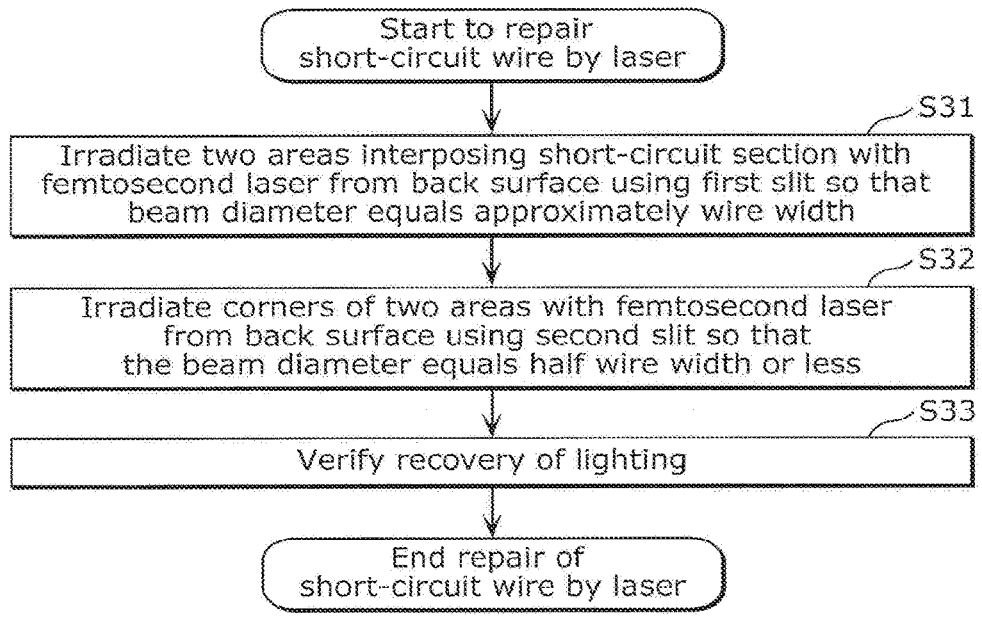
FIG. 6 is a flowchart illustrating repair processes for a display panel according to the embodiment.

FIG. 6 is a flowchart illustrating repair processes for a display panel according to the embodiment.

First, two areas interposing a short-circuit point is irradiated with a femtosecond laser from the back surface by using the first slit so that the beam diameter on a wire to be fabricated equals approximately the wire width (S31). Step S31 is the first laser irradiation process of reducing the beam diameter of the femtosecond laser in the drive circuit layer 11 to be approximately the wire width, and irradiating two areas interposing the short-circuit point therebetween with the femtosecond laser.

Figure 7:
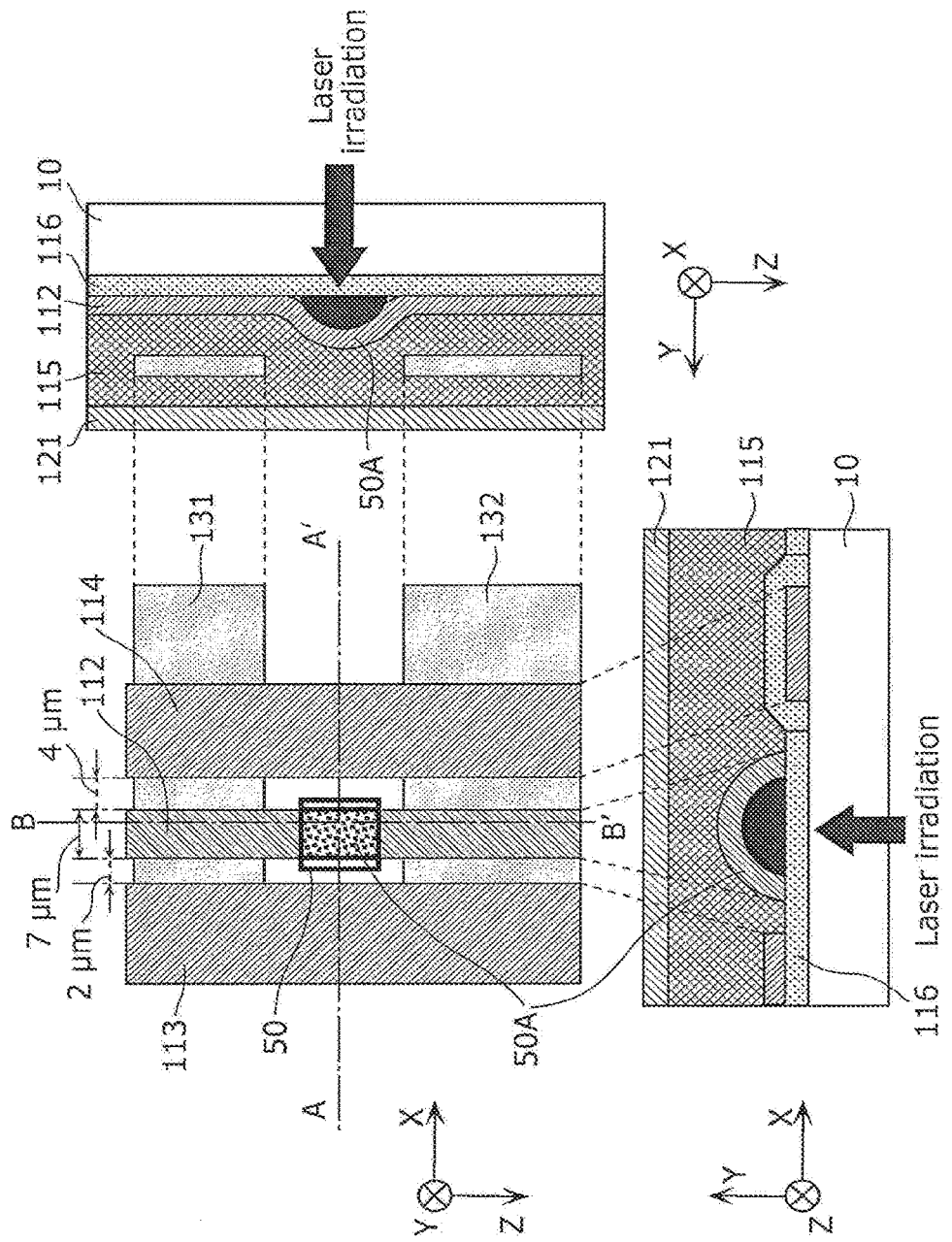
FIG. 7 is a three-view diagram illustrating a wiring state of the drive circuit layer in a first laser irradiation process according to the embodiment.

FIG. 7 is a three-view diagram illustrating a wiring state of the drive circuit layer in the first laser irradiation process according to the embodiment. Similarly to FIG. 4, FIG. 7 shows a perspective plan view of the drive circuit layer 11 when viewed from the image display side (in the Y-axis negative direction), and sectional views when the perspective plan view is cut along A-A' and B-B'. It is assumed that a short-circuit point is in the wire 112, FIG. 7 shows an irradiation area 50A which is one of the two areas interposing the short-circuit point. In step S31, the irradiation area 50A is irradiated with a femtosecond laser 50 from the opposite side (from the substrate 10) to the light-emitting layer 12 with respect to the drive circuit layer 11, the femtosecond laser 50 having a beam diameter approximately equal to the wire width in the irradiation area 50A.

As shown in the A-A' sectional view in FIG. 7, irradiation with the femtosecond laser 50 from the substrate 10 causes the wire 112 in the irradiation area 50A to be deformed, and the wire 112 and its lower layer, the insulation film 116 are separated at a central portion of the wire. Also, since irradiation is performed with the femtosecond laser 50 with the beam diameter reduced to approximately equal to the wire width, it is possible to fabricate the wire 112 without giving damage to the adjacent wire 113 and electrode wiring 114. However, in this step, the wire 112 and the insulation film 116 are in contact with each other at both ends of the deformed wire 112. When seen along B-B' sectional view which shows a section in the wire end area, although the wire 112 is also deformed in a wire extending direction, the wire 112 is continuous in the wire end area. In other words, in a state where step S31 is performed, the wire 112 is deformed in the irradiation area 50A, however, the wire 112 is continuous in the extending direction of the wire at the wire ends. Accordingly, the wire 112 is not disconnected at the irradiation area 50A.

Next, the corners of the two areas interposing the short-circuit point therebetween are irradiated with a femtosecond laser from the back surface by using the second slit so that the beam diameter on the wire to be fabricated equals half the wire width or less (S32). Step S32 is the second laser irradiation process of reducing the beam diameter of the femtosecond laser in the drive circuit layer 11 to be less than the beam diameter in step S31, and irradiating corners, which are the ends of the two areas interposing the short-circuit point therebetween in a wire extending direction and the ends of the two areas in a wire width direction, with the femtosecond laser.

Figure 8:
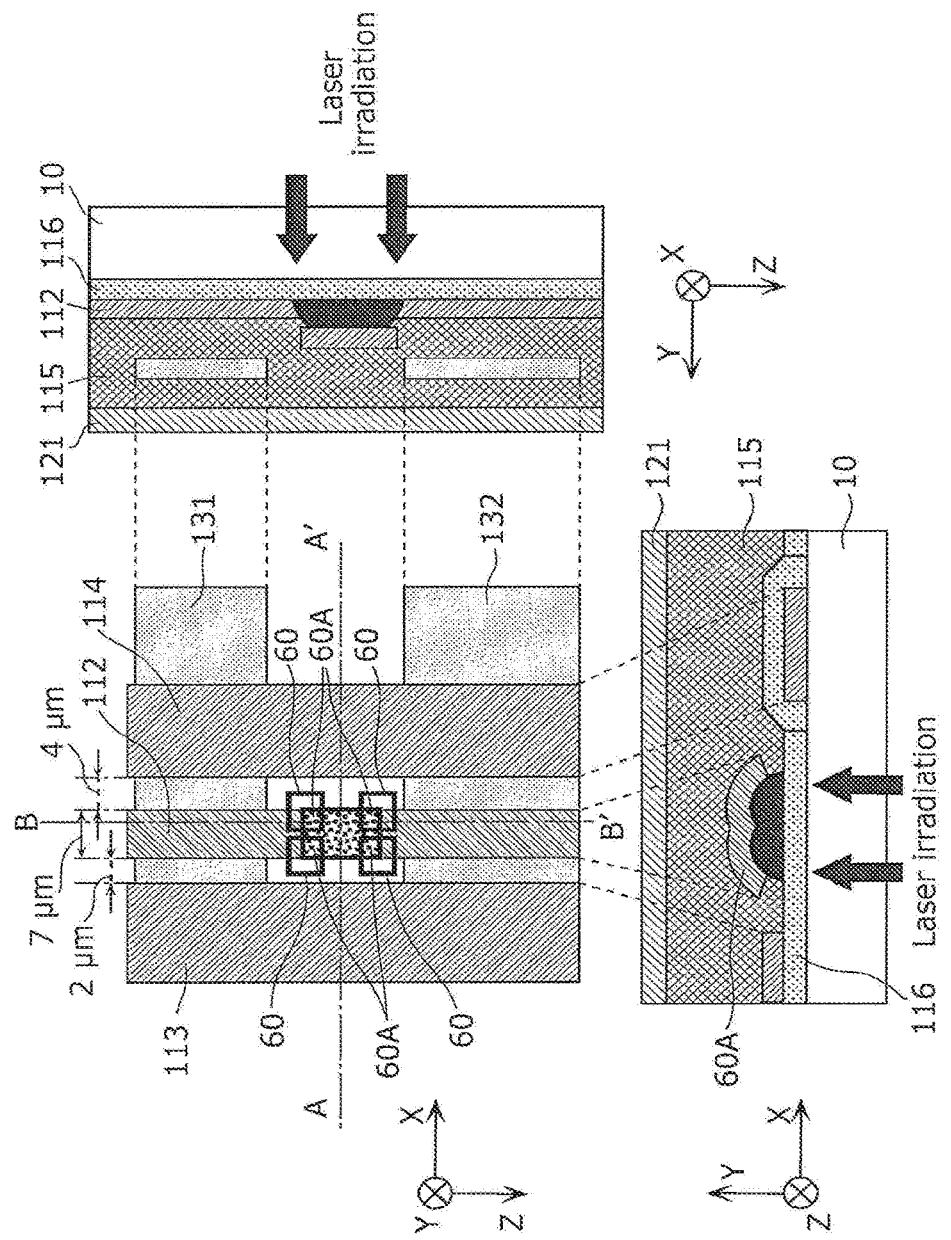
FIG. 8 is a three-view diagram illustrating a wiring state of the drive circuit layer in a second laser irradiation process according to the embodiment.

FIG. 8 is a three-view diagram illustrating a wiring state of the drive circuit layer in the second laser irradiation process according to the embodiment. Similarly to FIG. 4, FIG. 8 shows a perspective plan view of the drive circuit layer 11 when viewed from the image display side (in the Y-axis negative direction), and sectional views when the perspective plan view is cut along A-A' and B-B'. FIG. 8 shows an irradiation area which is one of the two areas interposing the short-circuit point of the wire 112 therebetween. In step S32, corner areas 60A at four corners, as the ends of the irradiation area 50A in a wire extending direction and the ends of the irradiation area 50A in a wire width direction, are each irradiated with the femtosecond laser 60 from the opposite side (from the substrate 10) to the light-emitting layer 12 with respect to the drive circuit layer 11, the femtosecond laser 60 having a beam diameter of half the wire width or less.

As shown in the A-A' sectional view in FIG. 8, irradiation with the femtosecond laser 60 from the substrate 10 causes the wire 112 in the corner areas 60A to be deformed, and the wire 112 and its lower layer, the insulation film 116 are separated at ends of the wire. When seen along B-B' sectional view which shows a section in the wire end area, the wire 112 is disconnected at each of the corner areas 60A in a wire extending direction.

It should be noted that although each of the corner areas 60A at four corners is irradiated with the femtosecond laser 60 in step S32, only the corner areas 60A at two adjacent corners in a wire width direction may be irradiated with the femtosecond laser 60. In this case, in the B-B' sectional view of FIG. 8, the wire 112 is disconnected at one point and not two points.

Finally, verification of recovery of lighting of the display panel, which has undergone steps S31 and S32, is performed. When a pixel desired to be recovered emits light normally, the repair process is completed. It should be noted that when the light emission of a pixel desired to be recovered is insufficient, steps S31 S33 may be performed again.

In the wire 112 having a short-circuit point where a short-circuit occurs with another wire or circuit element, the above repair process allows the wire 112 to be disconnected in each of the two areas interposing the short-circuit point therebetween. Accordingly, the short-circuit point is isolated from other areas of the wire 112. Consequently, each pixel connected to the short-circuit point maintains a dark spot pixel, but all the other pixels can be converted to normal pixels.

[4. Effects]

As described above, an aspect of the method for manufacturing a display panel according to this embodiment provides a method for manufacturing a display panel in which a plurality of pixels are arranged, each of the pixels including an organic EL element, and a circuit element and a wire that drive the light-emitting element to emit light, the method comprising: stacking a light-emitting layer 12 included in the organic EL element and a drive circuit layer 11 included in the circuit element and the wire; and irradiating a predetermined area of a wire with a femtosecond laser from an opposite side to the light-emitting layer 12 with respect to the drive circuit layer 11, the wire 112 having a short-circuit point at which a short-circuit occurs with the circuit element or the other wire. Here, the above-described laser irradiation process includes: the first laser irradiation process of reducing a beam diameter of the femtosecond laser in the drive circuit layer 11 to be approximately a wire width, and irradiating the predetermined area with the femtosecond laser; and the second laser irradiation process of, after the first laser irradiation process, reducing the beam diameter of the femtosecond laser in the drive circuit layer 11 to be less than the beam diameter in the first laser irradiation process, irradiating corners of the predetermined area, which are the ends of the predetermined area in a wire extending direction and the ends of the predetermined area in a wire width direction, with the femtosecond laser, thereby disconnecting the wire 112 at the predetermined area.

According to this, since a femtosecond laser irradiation is performed with a reduced beam diameter equal to approximately the wire width in the first laser irradiation process, it is possible to deform a short-circuit wire without causing damage to adjacent wires with a narrow pitch by a laser. In addition, since the corners are irradiated with a femtosecond laser with a reduced beam diameter of the femtosecond laser less than the wire width in the second laser irradiation process, it is possible to completely disconnect the corners of the short-circuit wire which have not been completely cut in the first laser irradiation process. Thus, it is possible to repair a wire having a short-circuit point stably with high accuracy.

Also, in the second laser irradiation process, multiple corners in each of the two predetermined areas interposing the short-circuit point therebetween may be irradiated with a femtosecond laser having a beam diameter of half the wire width or less.

With this, the wire area, including a short-circuit point and interposed by the two predetermined areas can be isolated, and thus each pixel other than the pixels connected to the isolated area can be saved. Thus, it is possible to repair a wire having a short-circuit point stably with high accuracy.

In the first laser irradiation process, a femtosecond laser emitted from a light source may be caused to pass through a first slit disposed in an emission direction of the light source, and the predetermined area may thereby be irradiated with the femtosecond laser, and in the second laser irradiation process, a femtosecond laser emitted from a light source may be caused to pass through a second slit having a slit diameter smaller than a slit diameter of the first slit, disposed in an emission direction of the light source, and the predetermined area may thereby be irradiated with the femtosecond laser.

Consequently, it is possible to control the beam diameter of the femtosecond laser on wires with high accuracy in the first laser irradiation process and the second laser irradiation process.

Other Embodiments

Although a method for manufacturing a display panel has been described thus far based on the embodiment, the present invention is not limited to the embodiment described above. Other embodiments achieved by combining any components in the embodiment, variations obtained by applying various modifications to the foregoing embodiment that can be conceived by a person of skill in the art which are within the scope of the essence of the present invention as well as various equipments with a built-in display panel manufactured by the method for manufacturing a display panel according to the embodiment are also included in the present invention.

In the above-described embodiment, a configuration has been shown in which the lower electrode is an anode and the upper electrode is a cathode. However, a configuration may be adopted in which the lower electrode is a cathode and the upper electrode is an anode. Furthermore, as the components of a pixel, the substrate, the planarization film, the anode, the hole injection layer, the light-emitting layer, the partition, the electron transport layer, the electron injection layer, the cathode, the thin-film sealing layer, the resin sealing layer, the color filter, and the transparent substrate are not limited to the configuration shown in the embodiment, and the material and the configuration, and the formation method may be changed. For example, a hole transport layer may be provided between the hole injection layer and the light-emitting layer.

Figure 9:
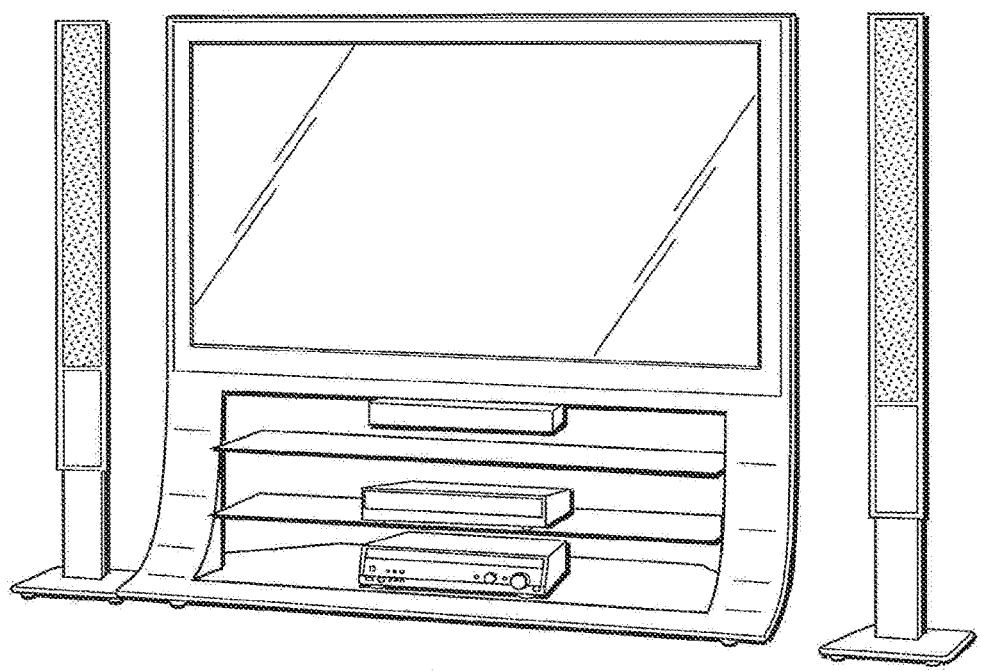
FIG. 9 is an external view of a thin flat-screen TV having the built-in display panel according to the embodiment.

Furthermore, for example, the present invention is preferred for manufacturing of a thin flat-screen TV system including a display panel as show in FIG. 9, which is manufactured by the manufacturing method according to this embodiment.

INDUSTRIAL APPLICABILITY

The method for manufacturing a display panel according to the present invention is useful for the technical field such as a flat TV and a display of a personal computer for which a big screen and a high resolution are desired.

The invention claimed is:

1. A method for manufacturing a display panel in which a plurality of pixels are arranged, each of the plurality of pixels including a light-emitting element, and a circuit element and a wire for driving light-emission of the light-emitting element, the method comprising:
    stacking a light-emitting layer included in the light-emitting element and a drive circuit layer included in the circuit element and the wire; and
    irradiating a predetermined area of a wire with a femtosecond laser from a side of the drive circuit layer opposite the light-emitting layer, the wire having a short-circuit point at which a short-circuit has occurred with the circuit element or the another wire,
    the irradiating including:
        setting a beam diameter of the femtosecond laser in the drive circuit layer to be approximately a wire width, and irradiating the predetermined area with the femtosecond laser with the beam diameter in the drive circuit layer set to be approximately the wire width, and
        after the irradiating the predetermined area with the femtosecond laser with the beam diameter in the drive circuit layer set to be approximately the wire width, reducing the beam diameter of the femtosecond laser in the drive circuit layer to be less than the wire width, and irradiating corners, which are an end of the predetermined area in a wire extending direction and an end of the predetermined area in a wire width direction, with the femtosecond laser with the beam diameter in the drive circuit layer set to be less than the wire width to disconnect the wire at the predetermined area.

2. The method for manufacturing a display panel according to claim 1,
    wherein in the reducing the beam diameter and irradiating the corners, the corners of each of two of the predetermined area interposing the short-circuit point between the two are irradiated with the femtosecond laser having a beam diameter of half of the wire width or less.

3. The method for manufacturing a display panel according to claim 1, wherein in the reducing the beam diameter and irradiating the predetermined area, the femtosecond laser emitted from a light source is caused to pass through a first slit disposed in an emission direction of the light source to irradiate the predetermined area with the femtosecond laser, and in the reducing the beam diameter and irradiating the corners, the femtosecond laser emitted from the light source is caused to pass through a second slit having a slit diameter smaller than a slit diameter of the first slit, disposed in an emission direction of the light source to irradiate the corners with the femtosecond laser.

4. The method for manufacturing a display panel according to claim 2, wherein in the reducing the beam diameter and irradiating the predetermined area, the femtosecond laser emitted from a light source is caused to pass through a first slit disposed in an emission direction of the light source to irradiate the predetermined area with the femtosecond laser, and in the reducing the beam diameter and irradiating the corners, the femtosecond laser emitted from the light source is caused to pass through a second slit having a slit diameter smaller than a slit diameter of the first slit, disposed in an emission direction of the light source to irradiate the corners with the fen second laser.

5. The method for manufacturing a display panel according to claim 1, wherein the irradiating the corners irradiates only the corners without irradiating an area other than the corners.

6. The method for manufacturing a display panel according to claim 1, wherein the irradiating the corners irradiates four corners.

\* \* \* \* \*